US008605502B1

(12) United States Patent
Desireddi et al.

(10) Patent No.: US 8,605,502 B1
(45) Date of Patent: Dec. 10, 2013

(54) SYSTEMS AND METHODS OF UPDATING READ VOLTAGES

(75) Inventors: Sateesh Desireddi, Andhra Pradesh (IN); Jayaprakash Naradasi, Bangalore (IN); Anand Venkitachalam, Bangalore (IN)

(73) Assignee: Sandisk Technologies Inc., Plano, TX (US)

( * ) Notice: Subject to any disclaimer, the term of this patent is extended or adjusted under 35 U.S.C. 154(b) by 0 days.

(21) Appl. No.: 13/523,680

(22) Filed: Jun. 14, 2012

(30) Foreign Application Priority Data

May 22, 2012 (IN) .......................... 2024/CHE/2012

(51) Int. Cl.
*G11C 16/04* (2006.01)
(52) U.S. Cl.
USPC ............... 365/185.03; 365/185.09; 365/185.2
(58) Field of Classification Search
USPC ........ 365/185.03, 185.09, 185.2, 189.09, 236
See application file for complete search history.

(56) References Cited

U.S. PATENT DOCUMENTS

| 7,903,468 | B2 | 3/2011 | Litsyn et al. |
| 7,911,834 | B2 * | 3/2011 | Cornwell et al. ........ 365/185.03 |
| 7,941,590 | B2 | 5/2011 | Yang et al. |
| 2010/0020611 | A1 | 1/2010 | Park |

* cited by examiner

*Primary Examiner* — David Lam
(74) *Attorney, Agent, or Firm* — Toler Law Group, PC (57) ABSTRACT

A method includes, in a data storage device that includes a non-volatile memory, reading first data values from memory elements of the non-volatile memory using a set of reference voltages that includes a first reference voltage, and determining a first error count associated with the first reference voltage. The method includes reading second data values from the group of memory elements using a set of modified reference voltages that includes a modified first reference voltage, and determining a modified error count associated with the modified first reference voltage. The method includes updating the set of reference voltages to include the first reference voltage or the modified first reference voltage based on a comparison of the error count to the modified error count.

21 Claims, 4 Drawing Sheets

SYSTEMS AND METHODS OF UPDATING READ VOLTAGES

CLAIM OF PRIORITY

The present application claims priority from Indian Patent Application No. 2024/CHE/2012 filed on May 22, 2012, which is incorporated herein in its entirety.

FIELD OF THE DISCLOSURE

The present disclosure is generally related to updating reference voltages in a data storage device.

BACKGROUND

Non-volatile memory devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices can provide increased storage density by storing 3 bits per cell, 4 bits per cell, or more.

Storing multiple bits of information in a single flash memory cell typically includes mapping sequences of bits to states of the flash memory cell. For example, a first sequence of bits "110" may correspond to a first state of a flash memory cell and a second sequence of bits "010" may correspond to a second state of the flash memory cell. After determining that a sequence of bits is to be stored into a particular flash memory cell, the particular flash memory cell may be programmed to a state (e.g., by setting a threshold voltage) that corresponds to the sequence of bits.

Once memory cells in the memory device have been programmed, data may be read from the memory cells by sensing the programmed state of each memory cell by comparing the cell threshold voltage to one or more reference voltages. However, the sensed programming states can sometimes vary from the written programmed states due to one or more factors, such as data retention and program disturb conditions.

SUMMARY

Accuracy of reading data stored in a data storage device may be improved by updating a set of reference voltages to reduce a count of errors associated with reading the stored data. A selection of a first updated reference voltage may be made by comparing an error count of read errors associated with a first reference voltage to a modified error count of read errors associated with a modified first reference voltage. For each of the set of reference voltages, either the reference voltage or the modified reference voltage may be selected based on a comparison of the error count to the modified error count. Each of the selections may be included in an updated set of reference voltages.

Alternatively, for each reference voltage, the updated reference voltage may be selected from among the reference voltage and several modified reference voltages based on a comparison of the corresponding error counts of read errors for the reference voltage and each of the modified reference voltages.

DETAILED DESCRIPTION

A programmed state of a particular data element of a data storage device may change over time due to various factors, such as time-related degradation of memory, program disturb factors, and other proximity-related factors. A cell voltage distribution of the data storage device may change over time depending on various parameters including a time elapsed since program, a temperature, a geometry (e.g., die/block/word line), and a number of program and erase cycles, as illustrative examples.

In order to maintain reliability and performance of a memory device, it may be beneficial for a memory controller of the memory device to timely update the reference voltages for the memory device. When a threshold voltage of a memory element changes, the change may be reflected in the magnitude of the reference voltage that correctly reads the stored data. That is, the reference voltage that is used to correctly sense the memory element threshold voltage may change over time. As a result, use of a fixed set of reference voltages may result in errors in data values read from memory elements whose threshold voltages have changed over time.

Improved error correction capability of data stored in a memory of a data storage device may be achieved with reduced latency by updating reference voltages based on a comparison of error counts. Systems and methods of updating each of a set of reference voltages by comparing an error count associated with each reference voltage to corresponding error counts associated with one or more modified reference voltages are disclosed.

Figure 1:
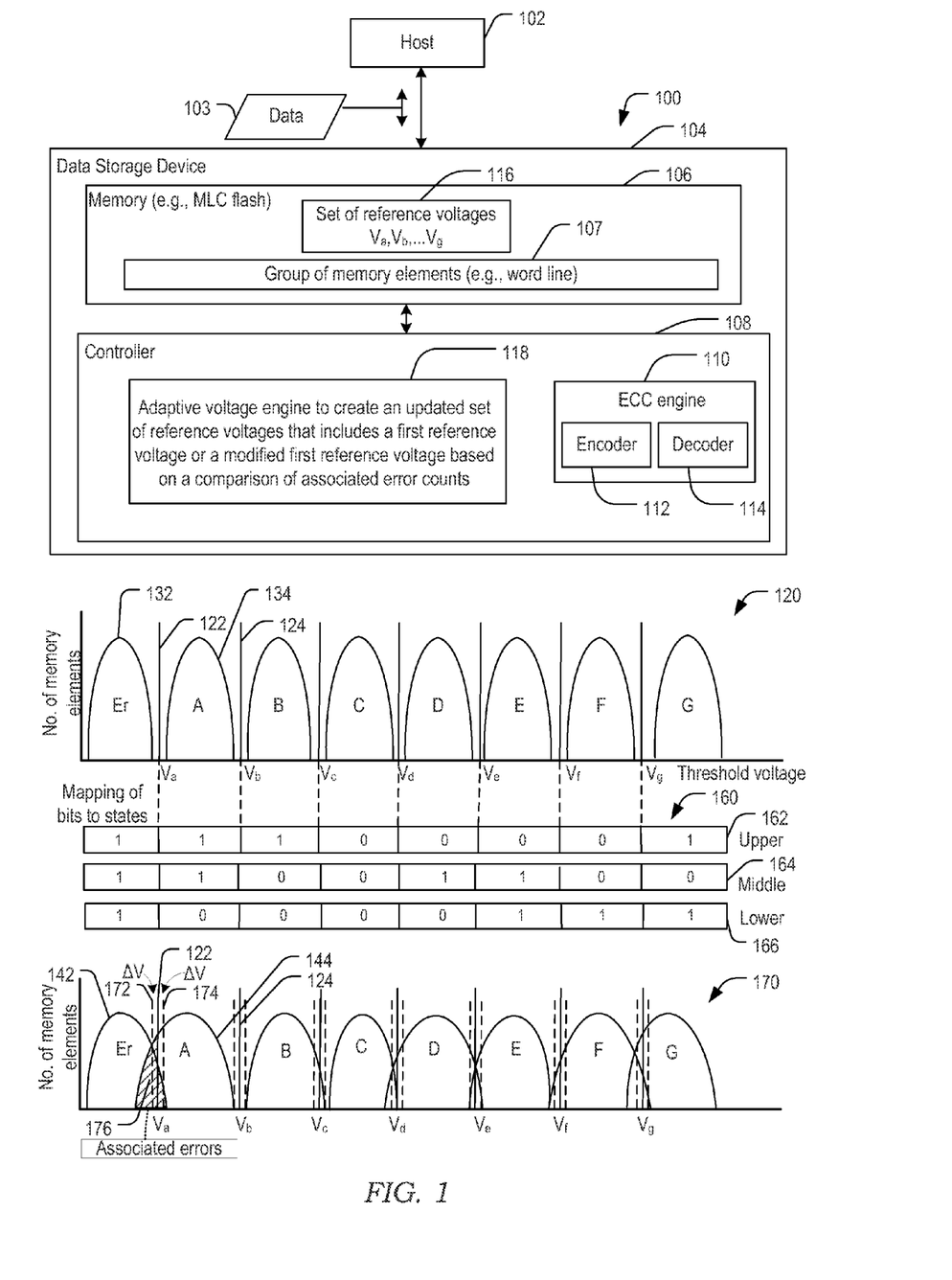
FIG. 1 is a general diagram of a first illustrative embodiment of a system including a data storage device that updates a set of reference voltages based on a comparison of an error count associated with each reference voltage to error counts associated with each of one or more modified reference voltages, and FIG. 1 graphically illustrates errors associated with a reference voltage due to overlapping of states of memory elements.

Referring to FIG. 1, a particular illustrative embodiment of a system generally designated 100 and including a data storage device 104 that is configured to update reference voltages. The system 100 includes the data storage device 104 coupled to a host device 102. The data storage device 104 includes a memory 106 coupled to a controller 108. The data storage device 104 is configured to enable exchange of data, such as data 103, between the host device 102 and the memory 106 of the data storage device 104.

The host device 102 may be configured to provide data to be stored at the memory 106 or to request data to be read from the memory 106. For example, the host device 102 may include a mobile telephone, a music or video player, a gaming console, an electronic book reader, a personal digital assistant (PDA), a computer such as a laptop computer, a notebook computer, or a tablet, any other electronic device, or any combination thereof.

The data storage device 104 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 104 may be embedded memory in the host device 102, such as eMMC® (trademark of JEDEC Solid State Technology Association, Arlington, Va.) memory and eSD memory, as illustrative examples.

The memory 106 may be a non-volatile memory of a flash device, such as a NAND flash device, a NOR flash device, or any other type of flash device. The memory 106 may include a group of memory elements 107. For example, the group of memory elements 107 may include a word line. Each memory element in the group of memory elements 107 may be a memory cell of a multi-level cell (MLC) memory.

Each memory element may have an associated threshold voltage corresponding to a state of the memory element. Each state may correspond to a particular range of threshold voltage values, such as depicted in a graph 120. The state of each memory element represents data stored at the memory element, such as according to a mapping 160 of bits to states of the memory element. The data stored at the memory element may be read by comparing the threshold voltage of the memory element to one or more reference voltages of a set of reference voltages 116 including reference voltages $V_a$, $V_b$, . . . $V_g$ that are stored in the memory 106. The set of reference voltages 116 may be used to sense the state of each of the memory elements of the group of memory elements 107.

The controller 108 may include an error correction code (ECC) engine 110. The ECC engine 110 may include an ECC encoder 112 and an ECC decoder 114. The ECC encoder 112 may be configured to encode data with error correction information. The ECC decoder 114 may be configured to decode the error correction information of the data read from the memory 106 to correct errors in the data, up to an error correction capability of the ECC decoder 114.

The controller 108 includes an adaptive voltage engine 118. The adaptive voltage engine 118 is configured to create an updated set of reference voltages that includes a first reference voltage, e.g., $V_a$ 122, or a modified first reference voltage based on a comparison of error counts associated with each of the first reference voltage and the modified first reference voltage, as described with reference to FIG. 2.

Graph 120 is a histogram illustrating a count of memory elements within a memory, such as the memory 106, vs. threshold voltage of the memory elements. For instance, the memory 106 may include multiple level cells (MLC), each MLC capable of storing data and each MLC having a threshold voltage corresponding to a data value of the stored data. In a particular embodiment, each of the MLC memory elements has a total of eight states. The eight states can be represented by three bits, illustrated in the mapping 160 as a first bit in an upper page 162, a second bit in a middle page 164, and a third bit in a lower page 166.

A first histogram curve 132 illustrates a distribution of memory elements of the group of memory elements 107 having a threshold voltage that is less than the reference voltage $V_a$ 122. Each memory element represented in the curve 132 is programmed to a state corresponding to a data value of 1 1 1, e.g., an "Erase state," or "Er," corresponding to a "1" bit in the upper page 162, a "1" bit in the middle page 164, and a "1" bit in the lower page 166.

A second histogram curve 134 represents all memory elements of the group of memory elements 107 having corresponding threshold voltages between voltage $V_a$ 122 and voltage $V_b$ 124. Each of these memory elements is programmed to a state corresponding to a data value of 1 1 0 (e.g., state "A" corresponding to a "1" bit in the upper page 162, a "1" bit in the middle page 164, and a "0" bit in the lower page 166.) In a similar fashion, each subsequent curve in the graph 120 lies between two reference voltages and represents memory elements that are programmed to threshold voltages corresponding to a data value as shown in the mapping 160. Each memory element in the group of memory elements 107 stores a data value corresponding to its programmed state, and the corresponding data value can be found in the mapping 160.

When the data is initially stored in the group of memory elements 107, each of the curves depicted in the graph 120 lies entirely between two reference voltages (e.g., the curve 132 lies entirely below reference voltage $V_a$ 122, and the curve 134 lies entirely between reference voltages $V_a$ 122 and $V_b$ 124). When the data stored in the group of memory elements 107 is read immediately following storage of the data, there may be no errors to be corrected by the ECC decoder 114. Because the curve 134 lies between two corresponding reference voltages, all memory elements represented in the curve 134 are read as storing the same value (e.g., all elements represented in the curve 134 store the value 1 1 0) and the ECC decoder 114 detects no errors in the sensed data. All memory elements of a curve are initially programmed to the same state.

The programmed state of a particular data element is reflected in the threshold voltage, and the threshold voltage may change over time due to various time-driven factors and proximity-related factors. An example of changing threshold voltages is illustrated in the graph 170. A curve 142 represents the memory elements that were initially depicted in the curve 132 of the graph 120, where the curve 132 has changed shape over time to become the curve 142. A portion of the curve 142 appears to the right of the reference voltage $V_a$ 122 and represents memory elements originally programmed to state Er but disturbed to have threshold voltages greater than $V_a$ 122. All memory elements to the right of the reference voltage $V_a$ 122 will be read to have a value of 1 1 0 (as shown in the mapping 160) instead of the value of 1 1 1 that was originally stored. Memory elements programmed to store 1 1 1 but read as storing the 1 1 0 value introduce an error in the lower page 166 that are reflected in an associated error count.

Curve 144 represents a histogram of memory elements for which the stored data value was 1 1 0, initially determinable from the reference voltages $V_a$ 122 and $V_b$ 124. That is, when the data was initially stored in the memory elements and represented by the curve 134 of the graph 120, the stored value of the data was 1 1 0, determined through use of the reference voltages $V_a$ 122 and $V_b$ 124. However, over time, the curve 134 has changed shape to become the curve 144. The curve 144 crosses over the reference voltage $V_a$ 122. As a result, some of the memory elements within the curve 144 that had been initially programmed to 1 1 0 no longer appear between the reference voltages $V_a$ 122 and $V_b$ 124. A portion of the curve 144 to the left of reference voltage $V_a$ 122 represents memory elements that may be read as having a stored value of 1 1 1, according to the mapping 160, instead of the originally stored value of 1 1 0. Thus, over time, the read values of some of the memory elements may be incorrect and may be counted as errors by the ECC decoder 114.

When the reference voltages of the set of reference voltages 116 are kept at their original values $V_a$ 122, $V_b$ 124, etc., reading the data values after a certain amount of time has passed may result in more errors in the read data values than if the set of reference voltages is updated. For example, a shaded area 176 (i.e., sum of areas under curves 142 and 144 extending beyond the original reference voltage $V_a$ 122) represents errors in values of data read using the original reference voltages $V_a$ 122, $V_b$ 124, etc. as a result of the curves 142 and 144 having shapes that are different than their respective original curves 132 and 134.

In a particular embodiment, the reference voltage $V_a$ 122 may be replaced by a modified reference voltage 172 that differs from the reference voltage $V_a$ 122 by an offset voltage $\Delta V$. For example, a (dashed) vertical line representing modified reference voltage 172 may intersect the crossing point of the curves 142 and 144. A portion of the curve 144 lies to the right of the modified reference voltage 172, and another portion of the curve 144 lies to the left of the modified reference voltage 172. The sum of the areas of these portions is a measure of the error count associated with the modified reference voltage 172. There may a smaller error count associated with modified reference voltage 172 than the error count associated with the reference voltage 122. Typically a first reference voltage (represented by a first straight line) that does not pass through the intersection of two adjacent histogram curves has an associated error count that is larger than a second reference voltage (represented by a second straight line) that passes through the intersection of the two adjacent histogram curves.

Considering an alternate modified reference voltage 174, a first region (of the curve 142) is right of the alternate modified reference voltage 174 and a second region (of the curve 144) is left of the reference voltage 174. The sum of the areas of first region and the second region corresponds to the error count associated with the alternate modified reference voltage 174. Of the three voltages 122, 172, and 174, the modified reference voltage 172 is closest to the intersection of curves 142 and 144, and therefore has the smallest associated error count.

By adjusting the voltage of each reference voltage $V_a$, $V_b$, etc., the count of read errors associated with each reference voltage may be reduced. Each of the reference voltages may be changed by adding or subtracting the same offset voltage $\Delta V$ from the original reference voltage (i.e., using a same value of $\Delta V$) or by adding or subtracting different offset voltages (i.e., using different values of $\Delta V$). By comparing the error count of data read errors associated with the reference voltage $V_a$ 122 with the error count of data read errors associated with the modified reference voltage V 172, a selection of an updated reference voltage may be made that reduces the error count of data errors. Alternatively, by comparing the error count using the reference voltage $V_a$ 122 to the error count using the alternate modified reference voltage 174, an updated reference voltage may be selected that results in a reduction of the error count of data read errors. Alternatively, a selection of an updated reference voltage may be made from among reference voltages 122, 172, and 174 to reduce read errors.

Figure 2:
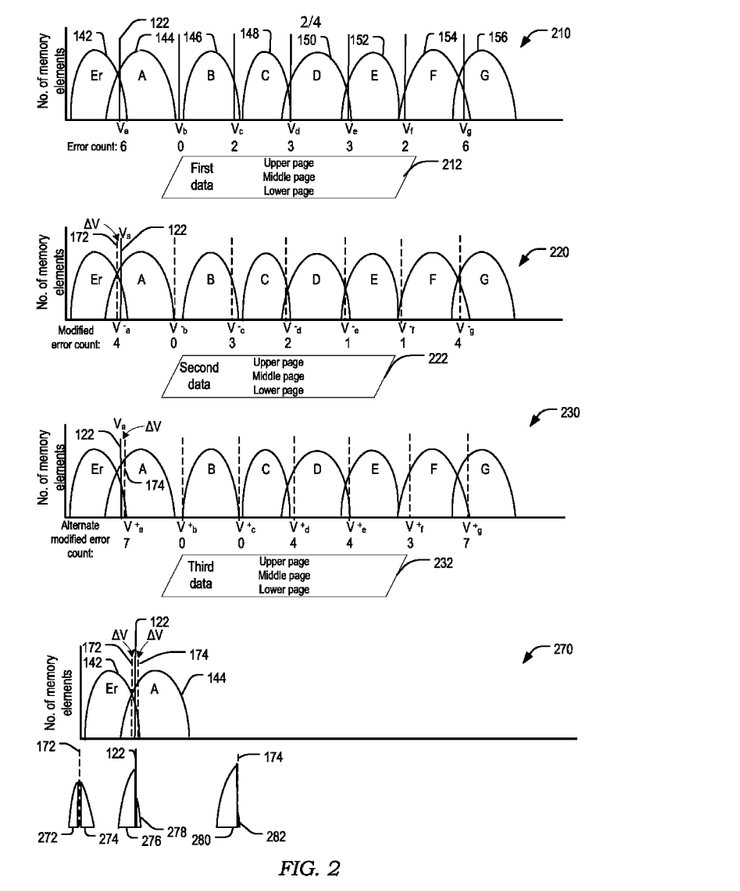
FIG. 2 is general diagram of a particular embodiment of a sensing scheme and includes a graphical depiction of a cell voltage distribution for states (Er, A, . . . G) of a multi-bit storage element of a memory of the data storage device of FIG. 1.

During operation, the controller 108 may be configured to read first data values from the group of memory elements 107 using the set of reference voltages 116 and to determine a first error count associated with a first reference voltage (e.g., a count of errors associated with $V_a$ 122, as described with respect to FIG. 2) of the set of reference voltages 116. The controller 108 may be configured to associate each error identified in the first data values with a corresponding reference voltage of the set of reference voltages 107. The controller 108 may be configured to read second data values from the group of memory elements 107 using a set of modified reference voltages and determine a modified error count associated with a modified first reference voltage (e.g., a count of errors associated with $V^-_a$ 172, as described with respect to FIG. 2). The controller 108 may be further configured to create an updated set of reference voltages that includes the first reference voltage $V_a$ 122 or the modified first reference voltage $V^-_a$ 172 based on a comparison of the first error count to the second error count.

The controller 108 may be further configured to determine a third error count associated with a second reference voltage, e.g., $V_b$ 124 of the set of reference voltages 107 and a fourth error count associated with a modified second reference voltage (e.g., $V_b - \Delta V$.) The controller 108 may be configured to include, in the updated set of reference voltages, the second reference voltage or the modified second reference voltage based on a comparison of the third error count to the fourth error count. Typically, the voltage (i.e., second reference voltage or modified second reference voltage) that is closest to the intersection of two intersecting histogram curves has the smaller associated error count.

As depicted in FIG. 1 for a 3-bit per cell (BPC) MLC memory, the set of reference voltages may include seven reference voltages. For example, the seven reference voltages may be $V_i$ (i=a, . . . g), as in graphs 120 and 170. Each memory element of the group of memory elements 107 of FIG. 1 may store three bits, as shown in the mapping 160 of FIG. 1. However, in other embodiments, there may be 2 bits per cell (3 reference voltages), 4 bits per cell (15 reference voltages), or a different number of bits per cell.

An updated set of reference voltages may result in reduced errors associated with read data. Reduced errors may result in a longer useful life of the data storage device 104. Additionally, the reduction in errors due to use of the updated set of references in reading the stored data may result in reduced processing at the ECC decoder 114, which may result in reduced read latency experienced by the host device 102.

FIG. 2 is a diagram of a particular embodiment of a sensing scheme and includes a graphical depiction of a cell voltage distribution in a memory including multi-level storage elements. A graph 210, corresponding to the graph 120 of FIG. 1, depicts a histogram showing a number of memory elements versus threshold voltage. Each of the curves 142, 144, 146, 148, 150, 152, 154, and 156 corresponds to a particular originally stored data value. For example, the memory elements represented in the curve 142 were originally programmed with the threshold voltage corresponding to the data value 1 1 1, illustrated as the curve 132 of FIG. 1. Over time, the curve 132 of FIG. 1 changed to the curve 142, typically due to physical effects such as program disturb.

Curve 144 corresponds to storage elements originally programmed to store the data value 110 (i.e., state A, according to the mapping 160 of FIG. 1). Similarly, the memory elements of each of the curves 146-156 have been programmed to a particular threshold voltage and corresponding stored data value, and each of the curves 142-156 in the graph 210 represents a distribution of threshold voltages that has changed from a corresponding curve of the graph 120 of FIG. 1.

Curves 142-146 and 150-156 include portions that cross over a reference voltage. For instance, the curve 142 has a portion that lies to the right of the reference voltage $V_a$ 122 and another portion that lies to the left of the reference voltage $V_a$ 122. However, each of the memory elements represented in the curve 142 was originally programmed to store the data value 1 1 1 (i.e., the curve 132 is entirely to the left of the reference voltage $V_a$ 122.) Hence, there will be errors in the read values (read by comparing a storage element's threshold voltage to the reference voltage $V_a$ 122) of the data stored in some of the memory elements represented by the curve 142. Similarly, there will be errors in the read values of the data stored in some of the memory elements represented by the curves 144-146 and 150-156, because each of these curves crosses a reference voltage of the original set of reference voltages $V_a$-$V_g$. Curve 148 lies entirely between the reference voltages $V_c$ and $V_d$, as originally programmed. Therefore, there will be no errors in the read data for memory elements represented by the curve 148.

First data 212 may be read from the memory 106 by the controller 108 of FIG. 1 and the read data may be output as an upper page, a middle page, and a lower page. For example, an initial portion of an output data stream may be the upper page, which is a stream of 1s and 0s that includes the uppermost bit extracted from the three-bit values read from each of the memory elements. That is, for each memory element, only the uppermost bit of the corresponding data value will be included in the upper page (i.e., each bit in the upper page 162 of FIG. 1 of the read data value of a memory element). A second portion of the output data stream is the middle page 164 that includes, for each memory element, the middle bit of the three-bit data value of each of the memory elements. A third portion of the output data stream includes a lower page 166 that corresponds to the lowest bit of the three-bit data value of each of the memory elements. Each of the upper, middle, and lower pages may include an ECC code word that is decoded independently of the other pages.

The ECC decoder 114 of FIG. 1 may determine a count of errors associated with the upper page 162 of the read data. In the mapping 160 of FIG. 1, there are only two transitional points in the upper page coding. That is, there are only two positions along the upper page of the mapping 160 where the value changes from 1 to 0 or from 0 to 1, corresponding to reference voltages $V_c$ and $V_g$. By receiving the read value of each of the memory elements, it is possible to determine that the most likely point of transition associated with the error(s) in the upper page reported by the ECC decoder 114 of FIG. 1 is either $V_c$ or $V_g$. Thus, a total error count of the readout of the upper page of the group of memory elements, plus the read data value, is sufficient information to select a particular point of transition in the upper page 162 of the mapping 160 associated with the errors. Specifically, a memory element that has an error in its upper page bit and that stores a "0" value in its lower page bit is most likely in state B (i.e., 1 0 0) or state C (i.e., 0 0 0) and the upper page error of the memory element is associated with reference voltage $V_c$. Similarly, a memory element that has an error in its upper page bit and that stores a "1" value in its lower page bit is most likely in state F (i.e., 0 0 1) or state G (i.e., 1 0 1) and the upper page error of the memory element is associated with reference voltage $V_g$. Similarly, a count of errors of the middle page of the read data and the read values of each of the memory elements is sufficient to associate the count of errors of the middle page with one of the reference voltages $V_b$, $V_d$, and $V_f$, and errors in the lower page of the read data are associated with one of $V_a$, and $V_e$ as may be determined through analysis of the read data values.

Thus, by analyzing the read data and the total error count for each of the upper page, middle page, and lower page of the read data 212, an error count may be associated with each reference voltage $V_a$-$V_g$. In the example shown in histogram 210, $V_a$ has an associated error count of 6, $V_b$ has an associated error count of 0, $V_c$ has an associated error count of 2, $V_d$ has an associated error count of 3, $V_e$ has an associated error count of 3, $V_f$ has an associated error count of 2, and $V_g$ has an associated error count of 6. For each reference voltage, the associated error count may be determined as a sum of error counts represented by the area of each portion of the histogram curve extending beyond the line represented by the reference voltage. For instance, considering $V_a$ 122, the error count contributed by curve 142 is represented by the portion of curve 142 that is to the right of $V_a$ 122 and the error count contributed by curve 144 is represented by the portion of curve 144 that is to the left of $V_a$ 122. The error count associated with $V_a$ 122 is the sum of the contributions from curves 142 and 144.

A graph 220 depicts a second histogram with a set of modified reference voltages $V^-_a$, $V^-_b$, etc. Each of the modified reference voltages has been determined by subtracting an offset voltage $\Delta V$ from a corresponding reference voltage. Each of the modified reference voltages $V^-_a$, $V^-_b$, ... $V^-_g$ is formed by subtracting the same amount $\Delta V$ from a corresponding reference voltage. However, in other embodiments, each of the modified reference voltages may be formed by subtracting different offset voltages from each of the corresponding original reference voltages.

The modified reference voltages, when used to read out second data 222 stored in the memory elements, results in modified error counts. For instance, modified reference voltage $V^-_a$ has a modified error count of 4, as compared with reference voltage $V_a$ that has the error count of 6. The modified reference voltage $V^-_e$ passes through the intersection of curves D and E and has a modified error count of 1, as compared with the original reference voltage $V_e$ that has an error count of 3.

An updated set of reference voltages may be selected based on the first data 212 and the second data 222 in order to reduce the error counts associated with the read data. For example, the modified reference voltage $V^-_e$ may be an advantageous choice to include in the updated set of reference voltages instead of the reference voltage $V_e$ because the modified error count associated with $V^-_e$ is smaller than the error count associated with $V_e$. In another example, there may be a smaller error count associated with the reference voltage $V^-_e$ (error count=2) than the modified error count associated with the modified reference voltage $V^-_e$ (modified error count=3). Therefore, including the reference voltage $V_e$ instead of the modified reference voltage $V^-_e$ in the updated set of reference voltages may result in a reduced error count. Similarly, a comparison can be made of corresponding error counts of each reference voltage to the corresponding modified reference voltage. An updated set of reference voltages may be determined by selecting the smaller error count and including its associated reference voltage in the updated set of reference voltages.

Although the updated set of reference voltages may be determined based on the first data 212 and the second data 222, in other implementations the updated set may be further determined based on one or more additional sets of modified reference voltages. A graph 230 depicts a third histogram with alternate modified reference voltages that are determined by adding an offset voltage to each of the original reference voltages. For example, an alternate modified reference voltage $V^+_a$ may be formed by adding an offset voltage $\Delta V$ to the value $V_a$ of the original reference voltage $V_a$. In similar fashion, alternate modified reference voltages can be formed from each of the original reference voltages $V_a$, $V_b$, $V_c$, etc. by adding the offset voltage $\Delta V$ to the original reference voltage. The same offset voltage ($\Delta V$) is added to each of the reference voltages. However, in other embodiments, the offset voltage added may be different for one or more reference voltages. Reading the storage elements using the alternate modified reference voltages results in third data 232. Errors detected in each of the upper, middle, and lower pages of the third data 232 may be attributed to the alternate modified reference voltages and a third set of associated counts ("read point error counts") may be determined, each read point error count associated with a unique reference voltage.

An updated set of reference voltages may be determined by comparing, for each reference voltage, error counts of the reference voltage (of the graph 210), the modified reference voltage (of the graph 220), and the alternative modified reference voltage (of the graph 230). An updated set of reference voltages may include a selected one of $V_a$, $V^-_a$, and $V^+_a$ based on a comparison of their respective error counts. For example, $V_a$ has an error count of 6, $V^-_a$ has a modified error count of 4, and $V^+_a$ has an alternate modified error count of 7. Therefore, the modified reference voltage $V^-_a$ may be selected to be included in the updated set of reference voltages based on a comparison of the error counts associated with each of $V_a$, $V^-_a$, and $V^+_a$. In another example, $V_g$ has an error count of 6, $V^-_g$ has a modified error count of 4, and $V^+_g$ has an alternated modified error count of 7. Therefore, $V^-_g$ will be selected to be included in the updated set of reference voltages based on a comparison of the error counts associated with each of $V_g$, $V^-_g$, and $V^{+g}$ In similar fashion, error counts associated with each reference voltage may be compared to the corresponding error counts associated with their corresponding modified reference voltage and alternate modified reference voltage. The selection of which of $V_i$, $V^-_i$, and $V^+_i$ (i=a, . . . g) to include in the updated set of reference voltages may be based on a comparison of corresponding error counts. The updated set of reference voltages may result in fewer read errors of the data stored in the memory elements.

A graphical depiction of errors associated with various choices of reference voltages is shown in a histogram graph 270. Over time, the curve 132, shown in the graph 120 of FIG. 1, has evolved to the curve 142. As a result, a portion 278 of the graph 142 lies to the right of the reference voltage $V_a$ 122. The curve 134 of the graph 120 of FIG. 1 has evolved to the curve 144. A portion 276 of the graph 144 lies to the left of reference voltage $V_a$ 122. An error count associated with $V_a$ 122 corresponds to a sum of areas of the portion 278 and the portion 276.

A modified error count associated with the modified reference voltage $V^-_a$ 172 corresponds to a sum of areas of a portion 274 (i.e., the portion of the curve 142 to the right of $V^-_a$ 172) and a portion 272 (i.e., portion of the curve 144 to the left of $V^-_a$ 172). An alternate modified error count associated with the alternate modified reference voltage $V^+_a$ 174 corresponds to a sum of areas of a portion 282 (i.e., the portion of the curve 142 to the right of $V^+_a$ 172) and a portion 280 (i.e., portion of the curve 144 to the left of $V^+_a$ 172).

Selection of an updated reference voltage from 122, 172, or 174 to be included in an updated set of reference voltages can be made by determining the smallest of the associated error counts and including the corresponding reference voltage (i.e., 122, 172, or 174) in the updated set of reference voltages. The updated set of reference voltages may result in a reduced error count associated with reading the data stored in the memory elements.

Figure 3:
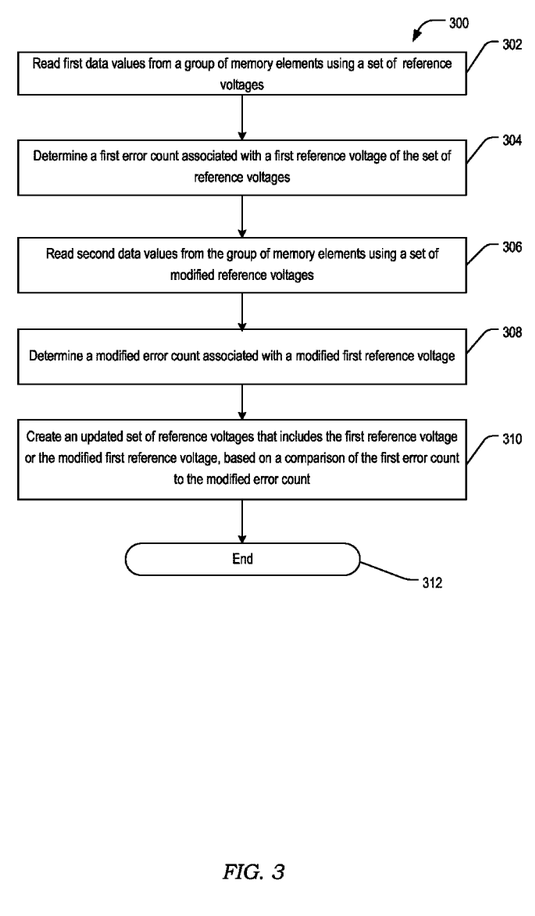
FIG. 3 is a flow diagram illustrating a particular embodiment of a method of updating reference voltages based on a comparison of error counts.

FIG. 3 is a flow diagram illustrating a particular embodiment of a method of updating reference voltages based on a comparison of error counts. First data values are read from a group of memory elements using an initial set of reference voltages, at 302. For example, the group of memory elements may be in the non-volatile memory 106 of FIG. 1, such as a flash memory. The first data values may include the first data 212 of FIG. 2.

A first error count associated with a first reference voltage of the initial set of reference voltages is determined, at 304. To illustrate, the first error count may correspond to errors associated with $V_a$ of FIG. 2 (i.e., error count of 6). Second data values are read from the group of memory elements using a set of modified reference voltages, at 306 (e.g., the second data 222 of FIG. 2.) A modified error count associated with a modified first reference voltage is determined, at 308. To illustrate, the modified error count may be associated with $V^-_a$ of FIG. 2 (i.e., error count of 4). An updated set of reference voltages is created, including the first reference voltage or the modified first reference voltage based on a comparison of the first error count to the modified error count, at 310. To illustrate, in FIG. 2 the error count of 6 for $V_a$ is greater than the modified error count of 4 for $V^-_a$, and therefore $V^-_a$ is selected to be included in the updated set of reference voltages. Similarly for all remaining reference voltages, selection of the corresponding updated reference voltage may be made by comparing the error count of the reference voltage to the error count of the corresponding modified reference voltage. The method ends at 312. The updated set of reference voltages may be stored in the memory 106 of FIG. 1 and may replace the set of reference voltages 116. The updated set of reference voltages stored in the memory 106 may be used to read the data values stored in the group of memory elements 107 of FIG. 1. For example, the updated set of reference voltages may be sent from the controller 108 to the memory 106 and may be stored in the memory 106, where the updated set of reference voltages is available for reading the stored data values in the group of memory elements 107.

In another example of updating a reference voltage of the set of reference voltages, a second error count associated with a second reference voltage of the set of reference voltages may be determined. For example, at the graph 210 of FIG. 2, an error count of 3 is associated with $V_e$. A modified second error count may be determined that is associated with a modified second reference voltage. For example, at the graph 220 of FIG. 2, a modified error count of 1 is associated with V. The second reference voltage (i.e., $V_e$) or the modified second reference voltage (i.e., $V^-_e$) may be included in the updated set of reference voltages based on a comparison of the second error count to the modified second error count. For example, in FIG. 2, the error count of 1 for $V^-_e$ is less than the error count of 3 for $V_e$, and therefore $V^-_e$ is selected to be included in the updated set of reference voltages.

Errors in the first data values and errors in the second data values may be identified by an ECC decoder, such as the ECC decoder 114 of FIG. 1. The first data values may be read from multiple logical pages, each logical page being decoded by the ECC decoder 114 of FIG. 1. Further, the second data values may be read from multiple logical pages, each logical page being decoded at the ECC decoder 114 of FIG. 1. Errors may be determined by the ECC decoder 114, e.g., after each logical page of data is read, after a block of data that includes multiple logical pages is read, when an expected movement in one or more of the reference voltages exceeds a threshold value, e.g., X millivolts, after a defined number of reads and/or writes to the memory 106, when a count of read errors exceeds a threshold error count, or in response to another condition.

The set of reference voltages may include seven reference voltages. For example, the seven reference voltages may be $V_i$ (i=a, . . . g), as in graphs 120 and 170 of FIG. 1 and the graph 210 of FIG. 2. Each memory element may store three bits. For example, each memory element of the group of memory elements 107 of FIG. 1 may store three bits, as shown in the mapping 160 of FIG. 1. In other implementations, each memory element of a group of memory elements may store less than three bits or more than three bits. For example, memory elements may store 2 bits per cell (to be read using 3 reference voltages), memory elements may store 4 bits per cell (to be read using 15 reference voltages), etc.

For each reference voltage of the set of reference voltages, a corresponding error count may be determined. For example, for each of the reference voltages $V_i$ (i=a, . . . g) of the graph 212 of FIG. 2, a corresponding error count is determined. For each of the reference voltages of the set of reference voltages a corresponding modified reference voltage may be determined by adding an offset voltage (i.e., a negative offset voltage or a positive offset voltage) to the reference voltage. For example, the graph 220 of FIG. 2 shows a set of modified reference voltages $V^-_i$ (i=a, . . . g) determined by adding a negative offset voltage to (i.e., subtracting $\Delta V$ from) the corresponding reference voltage $V_i$ (i=a, . . . g) and the graph 230 of FIG. 2 shows a set of alternate modified reference voltages $V^+_i$ (i=a, . . . g) determined by adding the offset voltage $\Delta V$ to each reference voltage $V_i$ (i=a, . . . g). A modified error count associated with each modified reference voltage may be determined. For example, the graph 220 of FIG. 2 shows the modified error count associated with each of the modified reference voltages $V^-_i$ (i=a, . . . g), and the graph 230 shows the alternate modified error count associated with each of the alternate modified reference voltages $V^+_i$ (i=a, . . . g). The reference voltage or the modified reference voltage may be included in the updated set of reference voltages based on a comparison of the corresponding error count to the corresponding modified error count. For example, by comparing the error count (error count of $V_e$=3) of $V_e$ shown in the graph 210 of FIG. 2 to the modified error count of $V^-_e$ (modified error count of $V^-_e$=1) shown in the graph 220 of FIG. 2, $V^-_e$ may be selected to be included in the updated set of reference voltages because $V^-_e$ has a smaller associated error count. The updated set of reference voltages may be stored in the memory 106 of FIG. 1, replacing the set of reference voltages 116.

The method 300 may also include reading alternate data values from the group of memory elements using a set of alternate modified reference voltages and determining an alternate modified error count associated with an alternate modified first reference voltage of the set of alternate modified reference voltages, such as the set of alternate modified reference voltages $V^+_i$ (i=a, . . . g) of the graph 230 of FIG. 2. The updated set of reference voltages may be changed or defined to include the first reference voltage, the modified first reference voltage, or the alternate modified first reference voltage based on a comparison of the first error count, the modified error count, and the alternate modified error count. For example, as shown in the graphs 210, 220, and 230 of FIG. 2, an error count (=3) is associated with $V_e$, a modified error count (=1) is associated with $V^-_e$, and an alternate modified error count (=4) is associated with $V^+_e$. An updated set of reference voltages may be changed or defined to include $V^-_e$ based on a comparison of the corresponding error count associated with each of $V_e$, $V^-_e$, and $V^+_e$.

By selecting each updated reference voltage based on a comparison of associated error counts, a total number of errors associated with reading data stored in memory may be reduced when reading data using the updated set of reference voltages. Updating the set of reference voltages can be accomplished during operation of a data storage device (e.g., after a defined number of read/write cycles, upon detecting that an expected movement in reference voltages exceeds a threshold value, in response to a periodic or aperiodic analysis of error counts, e.g., an error count exceeding an error count threshold, or in response to another indicator. Updating the set of reference voltages on a repeating basis can be advantageous in that the updating may compensate for increases in error counts due changes in the threshold voltages of some of the memory elements "on the fly." Reducing errors in data read from memory may extend the useful life of the memory and may result in reduced read latency.

Figure 4:
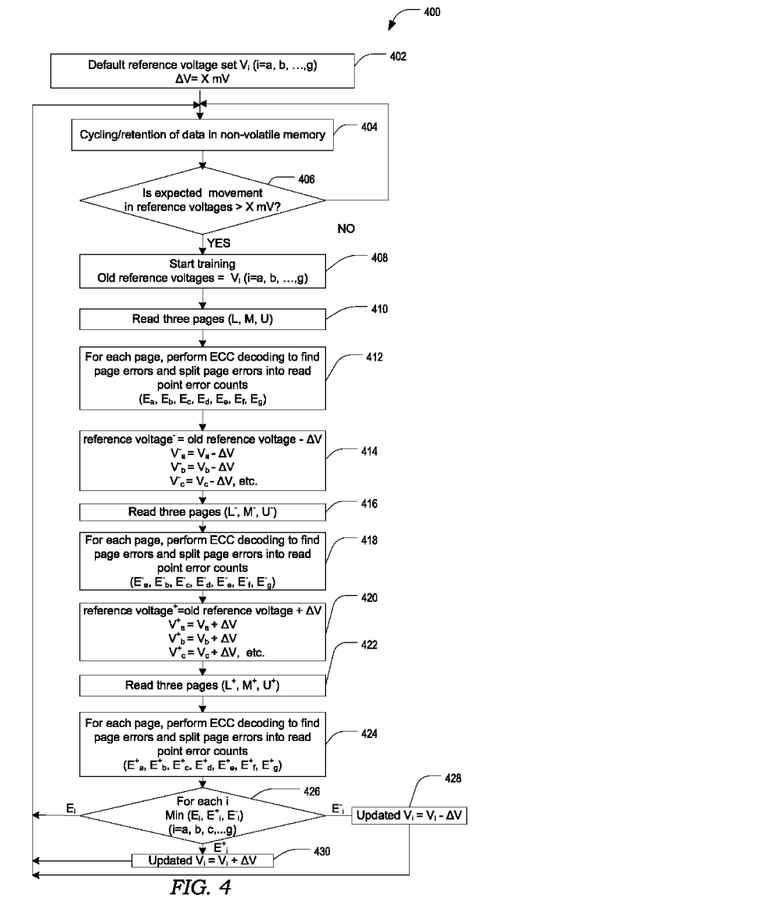
FIG. 4 is a flow diagram illustrating another particular embodiment of a method of updating reference voltages based on a comparison of error counts.

FIG. 4 is a flow diagram illustrating another particular embodiment of a method of updating reference voltages based on a comparison of error counts, and is generally designated 400. A default set of reference voltages $V_i$ (i=a, b, . . . g) and an offset voltage $\Delta V$=X millivolts (mV) where X is a threshold quantity, are established, at 402. Data is retained/cycled as part of normal operations in a non-volatile memory, at 404. A determination is made (e.g., in the controller 108 of FIG. 1) as to whether an expected movement in the reference voltages exceeds X mV, at 406. If the expected movement in each of the reference voltages does not exceed X mV, returning to 404, data cycling/retention in the non-volatile memory continues. If the expected movement in any of the reference voltages exceeds X mV, training is started with regard to the reference voltages, at 408.

Three pages of data (lower, middle, upper) are read, at 410. For each page, ECC decoding is performed to find page errors, and the page errors may be split into read point error counts ($E_a$, $E_b$, $E_c$, $E_d$, $E_e$, $E_f$, $E_g$), at 412. For example, in the graph 210 of FIG. 2, each read point error count ($E_a$, $E_b$, $E_c$, $E_d$, $E_e$, $E_f$, $E_g$) is the error count associated with the corresponding reference voltage $V_i$ (i=a, b, . . . g). Each modified reference voltage is calculated as (reference voltage −$\Delta V$), at 414. For example, in the graph 220 of FIG. 2, the modified reference voltage $V^-_a$ is calculated as $V_a$−$\Delta V$.

The three pages of data are again read using the modified reference voltages to determine the read data, at 416. The page errors may be determined by an ECC decoder such as the ECC decoder 114 of FIG. 1. For each page, ECC decoding is performed to find page errors, and the page errors may be split into read point error counts ($E^-_a$, $E^-_b$, $E^-_c$, $E^-_d$, $E^-_e$, $E^-_f$, $E^-_g$), at 418. For example, the read errors associated with $V^-_a$ may be determined, the read errors associated with $V^-_b$, may be determined, etc.

An alternate modified reference voltage may be determined from the reference voltage by adding $\Delta V$ to the reference voltage, at 420. Each of the three pages may be read again using the alternate modified reference voltages, at 422. The read data is sent to an ECC decoder, such as the ECC decoder 114 of FIG. 1, and errors may be determined. For each page, ECC decoding is performed to find page errors, and the page errors may be split into read point error counts ($E^+_a$, $E^+_b$, $E^+_c$, $E^+_d$, $E^+_e$, $E^+_f$, $E^+_g$), at 424.

For each $V_i$ (i=a, b, . . . g), a smallest of the determined read point error counts may be selected from among the read point error count $E_i$ (associated with the reference voltage $V_i$), the read point error count $E^-_i$ (associated with the modified reference voltage $V^-_i$) and the read point error count $E^+_i$ (associated with the alternate modified reference voltage $V^+_i$), at 426. The smallest of the read point error counts $E_i$, $E^-_i$, and $E^+_i$ is determined for each i=a, b, . . . g. An updated reference voltage associated with the smallest of the read point error counts $E_i$, $E^-_i$, $E^+_i$, and E is included in an updated set of reference voltages. If the smallest of the read point error counts $E_i$, $E^-_i$, and $E^+_i$ is associated with the reference voltage $V_i$, then the reference voltage is not changed and an updated set of reference voltages includes the original reference voltage. If the smallest of the three read point error counts $E_i$, $E^-_i$, and $E^+_i$ is $E^-_i$, an updated $V_i$ is set equal to $V_i$−$\Delta V$, at 428. If the smallest of the three read point error counts $E_i$, $E^-_i$, and $E^+_i$ is $E^+_i$, the updated reference voltage $V_i$ is set equal to $V_i$+$\Delta V$, at 430. The method returns to 404, where the memory operations continue using the updated set of reference voltages. For example, the updated set of reference voltages may be stored in the memory 106 of FIG. 1 and may replace the set of reference voltages 116. The updated set of reference voltages stored in the controller 108 may be used to read the data values stored in the memory 106 of FIG. 1. For instance, the updated set of reference voltages may be sent from the controller 108 to the memory 106 and may be stored in the memory 108, where the updated set of reference voltages is available for reading the stored data values in the group of memory elements 107.

The method 400 may be used to reduce error counts of read data. By selecting each updated reference voltage based on a comparison of associated error counts, a total number of errors associated with reading data stored in memory may be reduced. An additional advantage of reducing the error count may be a reduction in the load of the ECC decoder, which may result in faster data reads.

Although various components depicted herein are illustrated as block components and described in general terms, such components may include one or more microprocessors, state machines, or other circuits configured to enable a data storage device, such as the data storage device 104 of FIG. 1, to perform the particular functions attributed to such components. For example, the adaptive voltage engine 118 of FIG. 1 may represent physical components, such as controllers, processors, state machines, logic circuits, or other structures to create an updated set of reference voltages.

The adaptive voltage engine 118 may be implemented using a microprocessor or microcontroller programmed to generate control information and to create the updated set of reference voltages by reading a first set of data using a set of reference voltages and determining a read point error count associated with each reference voltage, reading a second set of data using modified reference voltages and determining a read point error count associated with each modified reference voltage, and for each reference voltage, selecting the reference voltage or the modified reference voltage to be included in the updated set of reference voltages based on a comparison of the read point error count of the reference voltage to the read point error count of the modified reference voltage. In a particular embodiment, the controller 108 includes a processor that executes instructions that are stored at the memory 106. Alternatively, or in addition, instructions that are executable by the processor may be stored at a separate memory location that is not part of the memory 106, such as at a read-only memory (ROM).

In a particular embodiment, the data storage device 104 may be a portable device configured to be selectively coupled to one or more external devices. For example, the data storage device 104 may be a removable device such as a universal serial bus (USB) flash drive or a removable memory card. However, in other embodiments, the data storage device 104 may be attached or embedded within one or more host devices, such as within a housing of a portable communication device. For example, the data storage device 104 may be within a packaged apparatus, such as a wireless telephone, a personal digital assistant (PDA), a gaming device or console, a portable navigation device, a computer, or other device that uses internal non-volatile memory. In a particular embodiment, the data storage device 104 includes a non-volatile memory, such as a Flash memory (e.g., NAND, NOR, Multi-Level Cell (MLC), Divided bit-line NOR (DINOR), AND, high capacitive coupling ratio (HiCR), asymmetrical contact-less transistor (ACT), or other Flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device that includes a non-volatile memory, performing,
      reading first data values from memory elements of the non-volatile memory using a set of reference voltages that includes a first reference voltage;
      determining a first error count, the first error count associated with the first reference voltage;
      reading second data values from the memory elements using a set of modified reference voltages that includes a modified first reference voltage;
      determining a modified error count, the modified error count associated with the modified first reference voltage of the set of modified reference voltages; and
      updating the set of reference voltages to include the first reference voltage or the modified first reference voltage based on a comparison of the first error count to the modified error count.

2. The method of claim 1, further comprising:
   determining a second error count, the second error count associated with a second reference voltage of the set of reference voltages;
   determining a modified second error count, the modified second error count associated with a modified second reference voltage; and
   updating the set of reference voltages to include the second reference voltage or the modified second reference voltage, based on a comparison of the second error count to the modified second error count.

3. The method of claim 1, wherein errors in the first data values and errors in the second data values are identified by an error correction code (ECC) decoder.

4. The method of claim 1, wherein the first data values are read from multiple logical pages, each logical page being decoded at an error correction code (ECC) decoder.

5. The method of claim 4, further comprising determining a count of page errors associated with each of the multiple logical pages and splitting the count of page errors into a plurality of read point error counts including the first error count, wherein each read point error count corresponding to each particular logical page of the multiple logical pages is determined based on data values corresponding to one or more other logical pages of the multiple logical pages.

6. The method of claim 1, wherein each memory element stores a plurality of bits.

7. The method of claim 1, wherein the method is performed in response to a determination of one of completion of a number of write/erase cycles of the memory elements, an indication that an expected movement in the reference voltage exceeds a threshold value, or an error count of read errors exceeding an error count threshold.

8. The method of claim 7, further comprising after updating the set of reference voltages, performing the method in response to a next determination of one of another completion of the number of write/erase cycles of the memory elements, another indication that the expected movement in the reference voltage exceeds the threshold value, or another instance of the error count of read errors exceeding the error count threshold.

9. The method of claim 1, wherein, the non-volatile memory is a flash memory.

10. The method of claim 1, further comprising:
reading alternate data values from the memory elements using a set of alternate modified reference voltages;
determining an alternate modified error count, the alternate modified error count associated with an alternate modified first reference voltage of the set of alternate modified reference voltages; and
updating the set of reference voltages to include the first reference voltage, the modified first reference voltage, or the alternate modified first reference voltage, based on a comparison of the first error count, the modified error count, and the alternate modified error count.

11. A method comprising:
in a data storage device that includes memory elements of a non-volatile memory, for each reference voltage of a plurality of reference voltages,
performing:
determining an error count, the error count associated with the reference voltage;
determining a modified reference voltage by adding a corresponding offset voltage to the reference voltage;
determining a modified error count, the modified error count associated with the modified reference voltage; and
including the reference voltage or the modified reference voltage in an updated plurality of reference voltages based on a comparison of the error count to the modified error count.

12. The method of claim 11, wherein each corresponding offset voltage has a common value.

13. The method of claim 11, wherein the error count is determined from data values that are read from the memory elements of the non-volatile memory using the reference voltage.

14. The method of claim 11, wherein the modified error count is determined from modified data values that are read from the memory elements of the non-volatile memory using the modified reference voltage.

15. A data storage device comprising:
a non-volatile memory including a plurality of memory elements; and
a controller, the controller configured to:
read first data values from a group of the memory elements using a set of reference voltages;
determine a first error count, the first error count associated with a first reference voltage of the set of reference voltages;
read second data values from the group of memory elements using a set of modified reference voltages;
determine a modified first error count, the modified first error count associated with a modified first reference voltage of the set of modified reference voltages; and
create an updated set of reference voltages that includes the first reference voltage or the modified first reference voltage, based on a comparison of the first error count to the modified first error count.

16. The data storage device of claim 15, further comprising an error correction code (ECC) decoder, the ECC decoder configured to identify first errors in the first data values and second errors in the second data values.

17. The data storage device of claim 15, wherein the controller is further configured to:
determine a second error count, the second error count associated with a second reference voltage of the set of reference voltages;
determine a modified second error count, the modified second error count associated with a modified second reference voltage; and
include in the updated set of reference voltages the second reference voltage or the modified second reference voltage, based on a comparison of the second error count to the modified second error count.

18. The data storage device of claim 15, wherein the first data values include multiple logical pages, each logical page being decoded at an error correction code (ECC) decoder.

19. The data storage device of claim 18, wherein the controller is further configured to:
determine a count of page errors associated with each of the multiple logical pages; and
split the count of page errors into a plurality of read point error counts including the first error count, wherein each read point error count corresponding to each particular logical page of the multiple logical pages is determined based on data values corresponding to one or more other logical pages of the multiple logical pages.

20. The data storage device of claim 15, wherein each memory element of the group of memory elements stores a plurality of bits.

21. The data storage device of claim 15, wherein the non-volatile memory is a flash memory.

* * * * *